(12) United States Patent
Kajigaya

(10) Patent No.: US 8,588,019 B2
(45) Date of Patent: Nov. 19, 2013

(54) SEMICONDUCTOR DEVICE HAVING CURRENT CHANGE MEMORY CELL

(75) Inventor: Kazuhiko Kajigaya, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 174 days.

(21) Appl. No.: 13/373,005

(22) Filed: Nov. 2, 2011

(65) Prior Publication Data

US 2012/0113735 A1   May 10, 2012

(30) Foreign Application Priority Data

Nov. 5, 2010  (JP) .................................. 2010-249206

(51) Int. Cl.
  *G11C 7/00* (2006.01)
(52) U.S. Cl.
  USPC ................... 365/203; 365/189.15; 365/189.09
(58) Field of Classification Search
  USPC .................. 365/189.011, 189.15, 189.09, 203
  See application file for complete search history.

(56) References Cited

U.S. PATENT DOCUMENTS

| | | | | |
|---|---|---|---|---|
| 6,888,756 B2 * | 5/2005 | Byeon et al. | ............. | 365/185.18 |
| 8,068,369 B2 * | 11/2011 | Kajigaya | ................ | 365/185.21 |
| 8,072,828 B2 * | 12/2011 | Kajigaya | ....................... | 365/207 |
| 8,174,903 B2 * | 5/2012 | Han et al. | ................. | 365/185.25 |
| 8,320,208 B2 * | 11/2012 | Kajigaya et al. | .............. | 365/207 |
| 8,422,316 B2 * | 4/2013 | Kajigaya | ................. | 365/189.09 |
| 2009/0257268 A1 | 10/2009 | Kajigaya | | |
| 2010/0061170 A1 | 3/2010 | Kajigaya | | |

FOREIGN PATENT DOCUMENTS

JP   2009-259379 A   11/2009
JP   2010-055730 A   3/2010

* cited by examiner

*Primary Examiner* — Vanthu Nguyen
(74) *Attorney, Agent, or Firm* — McGinn IP Law Group, PLLC

(57) ABSTRACT

A semiconductor device comprises a first transistor connected between a bit line and a sense node, and a second transistor amplifying a signal of the sense node. A first potential applied to a gate of the first transistor, a second potential supplied to the sense node, and a third potential supplied to the bit line are controlled so that the first potential applied to a gate of the first transistor is between the second and third potentials, the second potential is set larger than the third potential, and a predetermined potential obtained by subtracting a threshold voltage of the first transistor from the first potential is smaller than the third potential and higher than a low potential supplied to the second transistor. A potential of the bit line transitions from the third potential toward the low potential in accordance with data of a current change memory cell.

21 Claims, 12 Drawing Sheets

SEMICONDUCTOR DEVICE HAVING CURRENT CHANGE MEMORY CELL

BACKGROUND OF THE INVENTION

1. Field of the Invention

The invention relates to a semiconductor device comprising a single-ended sense amplifier circuit amplifying data that is stored in a current change memory cell and is read out to a bit line.

2. Description of Related Art

A current change memory cell has been conventionally known, which stores data in accordance with an amount of current flowing through a selected memory cell. In a semiconductor device using this type of memory cell, it is desirable to employ a single-ended sense amplifier having a small circuit scale instead of a differential type sense amplifier in terms of shrinking chip area. Further, miniaturization of the memory cell requires a low voltage operation, in which it is desirable to supply a potential as low as possible to the bit line connected to the memory cell.

For example, Patent Reference 1 discloses a semiconductor device having memory cells each storing data in accordance with a resistance value between a signal input/output terminal and a power supply terminal and having a single-ended sense amplifier that amplifies a signal outputted from the input/output terminal using one MOS transistor (Q1). By using the sense amplifier shown in Patent Reference 1, it is possible to reduce a capacitance value of bit lines in a read operation of the memory cells.

Further, for example, Patent Reference 2 discloses a configuration in which a MOS transistor functioning as a charge transfer gate is disposed between a bit line connected to memory cells and a sense node at an input of a single-ended sense amplifier. By employing the sense amplifier configured in this manner, it is possible to secure operating margin required for the amplifying operation of the sense amplifier in a read operation of the memory cells.

[Patent Reference 1] Japanese Patent Application Laid-open No. 2009-259379 (U.S. Pub. No. 2009/0257268 A1)

[Patent Reference 2] Japanese Patent Application Laid-open No. 2010-55730 (U.S. Pub. No. 2010/0061170 A1)

However, according to the technique disclosed in Patent Reference 1, when the sense amplifier drives an output node connected to a global bit line, a gate voltage of the MOS transistor (Q1) is limited lower than a precharge voltage of the bit line or lower than a voltage supplied to the memory cells. Therefore, when the gate voltage is decreased with miniaturization of the memory cells, there causes a decrease in speed with which the sense amplifier drives the global bit line. Meanwhile, according to the technique disclosed in Patent Reference 2, when the charge is transferred between the bit line and the sense node via the charge transfer gate (Q1), potential settings for the bit line and the sense node cannot be independently performed, which causes that reading speed is decreased when the potential of the bit line is lowered with the miniaturization of the memory cells. In this manner, the conventional configuration cannot achieve a semiconductor device capable of a high-speed read operation with lowering the potential for the bit lines in the read operation of the current change memory cell.

SUMMARY

One of aspects of the invention is a semiconductor device comprising: a memory cell storing data in accordance with an amount of current supplying capability: a bit line electrically connected to the memory cell, the bit line transmitting the data of the memory cell; a first transistor having a gate terminal connected to a first signal line supplied with at least a first potential as a transfer control voltage, one source/drain terminal connected to the bit line, and another source/drain terminal connected to a sense node; a second transistor having a gate terminal connected to the sense node, a drain terminal connected to an output node, and a source terminal connected to a signal line supplied with a low potential, the second transistor amplifying the signal transmitted from the bit line to the sense node via the first transistor; a sense node potential supplying circuit supplying a second potential to the sense node in response to a precharge control signal; a bit line potential supplying circuit supplying a third potential to the bit line in response to the precharge control signal; and a potential control circuit controlling at least the first to third potentials. In the semiconductor device of the invention, the potential control circuit controls the first potential to be between the second and third potentials, controls the second potential to be larger in absolute value than the third potential, and controls a predetermined potential obtained by subtracting a threshold voltage of the first transistor from the first potential to be smaller in absolute value than the third potential and larger in absolute value than the low potential, and a potential of the bit line transitions from the third potential toward the low potential in accordance with the data of the memory cell, regardless of "1" or "0" of the data.

According to the semiconductor device of the invention, in the read operation of the current change memory cell, the first transistor functions as a charge transfer gate, which controls a charge transfer between the bit line and the sense node in response to the transfer control voltage (the first potential) applied to its gate. In order to achieve a low voltage operation in the semiconductor device, the third potential supplied to the bit line needs to be set to a low value. In contrast, the second potential supplied to the sense node needs to be set higher than the third potential to improve current driving ability of the second transistor, thereby speeding up the read operation. In the semiconductor device of the invention, the second potential is set higher than the third potential, and the predetermined potential (the potential obtained by subtracting the threshold voltage of the first transistor from the first potential) at which the first transistor is switched on (conductive) and off (non-conductive) is set within a range including the third potential and the low potential corresponding to binary data that can be stored in the memory cell, thereby achieving a high-speed read operation of the sense amplifier by controlling the charge transfer between the bit line and the sense node.

The invention can be applied to various configurations of the memory cell array, and particularly, the invention can be effectively applied to a memory cell array having the hierarchical bit line. That is, by applying the invention to the configuration in which there are provided local bit lines of a lower hierarchy and global bit lines of an upper hierarchy and global sense amplifiers that amplify signals transmitted through the global bit lines through local sense amplifiers connected to the local bit lines, it is possible to suppress an increase in area and an increase in consumption current, and to achieve the high-speed read operation.

The first potential supplied to the first transistor as the charge transfer gate may be a potential with which process variation and temperature dependence of the threshold voltage of the first transistor are compensated.

As described above, according to the present invention, in the semiconductor device having a configuration in which data stored in the current change memory cell is read out to the bit line and amplified by the sense amplifier through the charge transfer gate, the potential of the sense node is maintained high even when the bit line voltage is lowered, and thus it is possible to perform the high-speed read operation.

Further, in the semiconductor device in which the memory cell array is hierarchized, when the signal transmitted from the local bit line to the global bit line via the local sense amplifier is amplified by the global sense amplifier, it is possible to suppress an increase in area and an increase in consumption current and to achieve the high-speed read operation.

Furthermore, the process variation and the temperature dependence of the threshold voltage of the first transistor are compensated for the first potential that is supplied to the first transistor as the charge transfer gate, it is possible to further improve the operating margin in the read operation.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below. However, it goes without saying that the present invention is not limited to the example of the technical idea and should be construed based on the disclosure of the claims.

Figure 1:
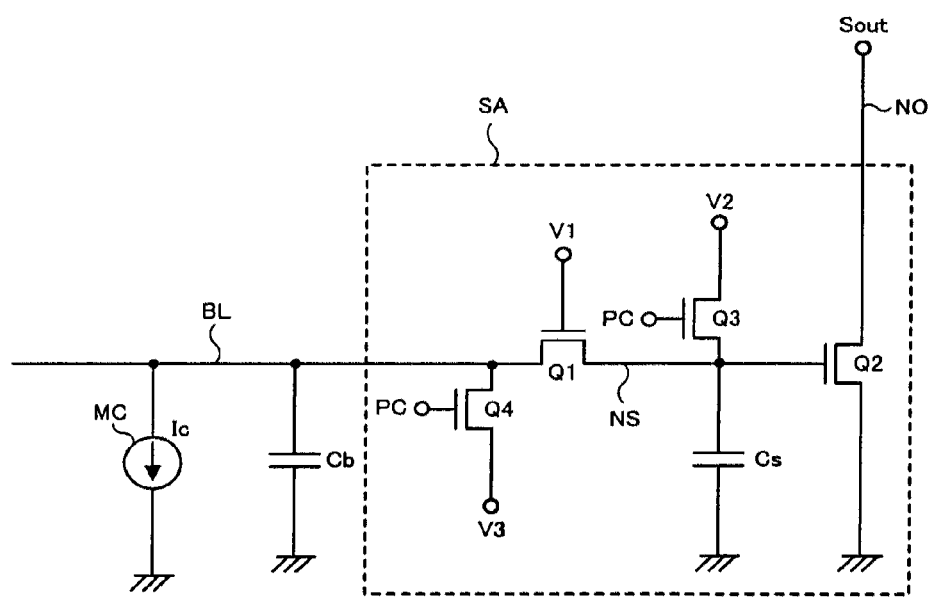
FIG. 1 is a circuit configuration showing basic operating principle of the invention as a technical idea of the invention.

In the following, an example of the technical idea of the invention is applied to a semiconductor device shown in FIG. 1 in which a sense amplifier SA and a memory cell MC are provided. FIG. 1 is a circuit configuration showing basic operating principle of the invention, which is an example within a range including the sense amplifier SA and the memory cell MC. As shown in FIG. 1, the semiconductor device of the invention comprises the memory cell MC of a current change type that stores data in accordance with an amount of current Ic flowing in a selected state, a bit line BL connected to the memory cell MC, and transistors Q1, Q2, Q3 and Q4 forming the sense amplifier SA. For example, as shown in FIG. 1, NMOS Field-Effect Transistors are used as the transistors Q1 to Q4. The transistor Q1 (the first transistor) functioning as a charge transfer gate controls an electrical connection between the bit line BL connected to one of source/drain terminals and a sense node NS connected to the other of the source/drain terminals in response to a potential V1 (the first potential) as a transfer control voltage applied to a gate terminal. The transistor Q2 (the second transistor) functioning as an amplifying element has a gate terminal connected to the sense node NS, a drain terminal connected to an output node NO, and a source terminal connected to a ground potential. The transistor Q2 amplifies a signal transmitted from the bit line BL to the sense node NS via the transistor Q1, and outputs an output signal Sout to the output node NO. The transistor Q3 (the third transistor) functioning as a sense node potential supply circuit supplies a potential V2 (the second potential) to the sense node NS in response to a precharge control signal PC. The transistor Q4 (the fourth transistor) functioning as a bit line potential supply circuit supplies a potential V3 (the third potential) to the bit line BL in response to the precharge control signal PC. The potentials V1, V2 and V3 are controlled by a voltage control circuit (not shown). In addition, it can be clearly understood from the technical idea of the invention that the ground potential is one example and can be replaced with a low potential being smaller in absolute value than a predetermined potential V1−Vt1 that is obtained by subtracting a threshold voltage Vt1 of the transistor Q1 from the potential V1. Further, the predetermined potential V1−Vt1 has a potential distribution corresponding to variation of the threshold voltage Vt1 of the transistor Q1. The voltage control circuit controls the potential V1 so that the potential distribution thereof has an upper limit value smaller in absolute value than the potential V3 and a lower limit value larger in absolute value than the low potential. The voltage control circuit may control the potential V3 instead of controlling the potential V1, and may control both the potentials V1 and V3.

Although FIG. 1 shows only one memory cell MC, in practice a plurality of memory cells MC are connected to one bit line BL. Therefore, there is a parasitic capacitance Cb on the bit line BL. The value of the parasitic capacitance Cb depends on the number of memory cells MC connected to the bit line BL. For example, if 128 memory cells MC are connected to the bit line BL, the value of the parasitic capacitance Cb is about 10 fF. Further, there is a parasitic capacitance Cs on the sense node NS. As shown in FIG. 1, since only three transistors Q1, Q2 and Q3 are connected to the sense node NS, the value of the parasitic capacitance Cs becomes small such as, for example, 1 fF.

In FIG. 1, potential relation in a read operation of the sense amplifier SA of the invention is controlled so that the transfer control voltage is set to be at least the potential V1 (the first potential) and the potential V2 (the second potential) is larger in absolute value than the potential V3 (the third potential). Further, the predetermined potential obtained by subtracting the threshold voltage of the transistor Q1 from the potential V1 is controlled to be smaller in absolute value than the potential V3 and larger in absolute value than the ground potential. Specific operations at this point will be described below (see FIG. 2). The semiconductor device of the invention is capable of independently setting the potentials V2 and V3, as different from the conventional configuration, and therefore when the potential V3 becomes small due to the voltage lowering of the bit line BL, the potential V3 with a sufficiently high value can be supplied to the sense node NS, and current driving ability of the single-ended type transistor Q2 can be improved so as to speed up the read operation.

Figure 2:
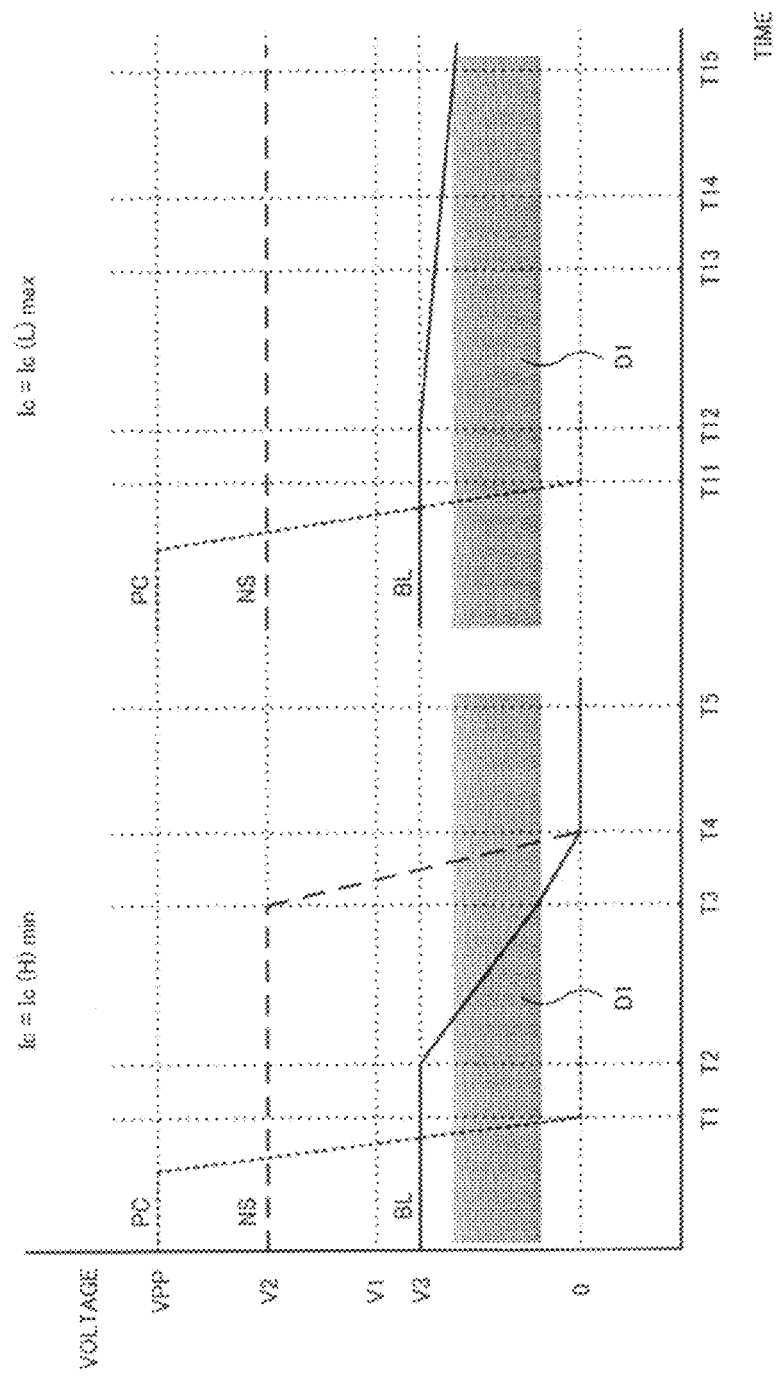
FIG. 2 is an operation waveform diagram for explaining a specific read operation based on operating principal of a sense amplifier of FIG. 1.

FIG. 2 exemplifies operation waveforms for explaining a specific read operation based on the operating principal of the sense amplifier SA of FIG. 1. The left part of FIG. 2 shows operation waveforms in a case of flowing a large current Ic corresponding to high level data (for example, data "1") of the memory cell MC, and the right part of FIG. 2 shows operation waveforms in a case of flowing a small current Ic corresponding to low level data (for example, data "0") of the memory cell MC. In addition, current values of the currents Ic of the memory cell MC in respective operations of the left and right parts of FIG. 2 are assumed to be Ic(H)min (left side) as a minimum value of a distribution corresponding to the high level data and Ic(L)max (right side) as a maximum value of a distribution corresponding to the low level data, respectively. It is understood from the feature of the current change memory cell MC that the potential of the bit line BL transitions from the high potential (V3) toward the low potential (VSS) in both cases of the high level data and the low level data of the memory cell MC.

In the read operation of the high level data, during a precharge period prior to a time T1, the control signal PC is at a high level (a potential VPP), the sense node NS is in a state of being precharged to the potential V2, and the bit line BL is in a state of being precharged to the potential V3. Here, the predetermined potential V1−Vt1 obtained by subtracting the threshold voltage Vt1 of the transistor Q1 from the potential V1 has a voltage value within a range of a potential distribution D1 shown in FIG. 2, and the potential distribution is lower than both the potentials V2 and V3. Therefore, potentials of the source/drain of the transistor Q1 are maintained high so that the transistor Q1 is in an OFF state. In addition, the reason why the potential distribution D1 of the above predetermined potential V1−Vt1 has the range between its upper and lower limits is that respective transistor Q1 in a large number of sense amplifiers SA have variation factors including random variation of the threshold voltage Vt1, fluctuation of the threshold voltage Vt1 from a reference value due to process variation, temperature dependence in operations using the threshold voltage Vt1, and the like.

At the time T1, the precharge control signal PC is changed to a low level, the transistor Q4 is turned off so that the bit line BL becomes floating in a state of being precharged to the potential V3, and the transistor Q3 is turned off so that the sense node NS becomes floating in a state of being precharged to the potential V2. Subsequently, the large current Ic (H) min flows through a memory cell MC selected at a time T2, and thereby electric charge stored in the parasitic capacitance Cb of the bit line BL is rapidly extracted, which allows the potential of the bit line BL to decrease from the potential V3. Then, at a time T3 at the latest, the potential of the bit line BL becomes lower than the lower limit of the potential distribution D1 of the predetermined potential V1−Vt1, and the transistor Q1 turns on. When the transistor Q1 turns on, electric charge stored in the parasitic capacitance Cs of the sense node NS is rapidly extracted, which allows the potential of the sense node NS to decrease from the potential V2. Then, at a time T4 at the latest, the potential of the bit line BL and the potential of the sense node NS reach the ground potential (0V) respectively. Thereafter, during a period from the time T4 to a time T5, the gate potential of the transistor Q2 is maintained at the ground potential and the transistor Q2 is in an OFF state. Therefore the high level data can be read to the output node NO.

Meanwhile, in the read operation of the low level data, the state in the precharge period prior to a time T11 is the same as in the read operation of the high level data. Further, the potential distribution D1 of the predetermined potential V1−Vt1 is also the same as in the read operation of the high level data. In addition, times T11 to T15 represented for the read operation of the low level data have the same time intervals as those for the above times T1 to T5 respectively.

At the time T11, the bit line BL becomes floating in a state of being precharged to the potential V3, and the sense node NS becomes floating in a state of being precharged to the potential V2, in the same manner as the read operation of the high level data. Subsequently, the small current Ic (L)max flows through a memory cell MC selected at a time T12, and thereby electric charge stored in the parasitic capacitance Cb of the bit line BL is slowly extracted, which allows the potential of the bit line BL to slowly decrease from the potential V3. In this case, the potential of the bit line BL reaches the upper limit of the potential distribution D1 of the predetermined potential V1−Vt1 at a time T15 at the earliest. Accordingly, since the transistor Q1 is maintained in an OFF state during a period until the time T15, the electric charge stored in the parasitic capacitance Cs of the sense node NS is not extracted. As a result, the sense node NS is maintained at the potential V2 during a period from the time T13 to the time T15 at the earliest through the time T14. At this point, the gate potential of the transistor Q2 is maintained at the potential V2, and thus the low level data can be read to the output node NO due to the transistor Q2 being in an ON state.

According to the configuration of the invention, in the above read operation, it is possible to independently set the potential V2 to be supplied to the sense node NS and the potential V3 to be supplied to the bit line BL. In the example of FIG. 2, the potential V2 is set to a higher voltage value than the potential V3. In general, in order to achieve miniaturization of the memory cell MC and a reduction in consumption current, the potential V3 to be supplied to the bit line BL needs to be set low. However, according to the invention, even if the potential V2 is set low, the potential V3 can be set relatively high, and thus the current driving ability of the transistor Q2 can be kept high in the read operation. As a result, the transistor Q2 can be operated with high-speed, and it is possible to obtain an effect of shortening a read time of the sense amplifier SA.

Preferred embodiments of the invention will be described in detail below with reference to accompanying drawings. In the following embodiments, the present invention is applied to a semiconductor device in which a memory cell array is configured using the current change memory cells MC and there is provided the sense amplifier SA that operates in accordance with the basic operating principle of FIGS. 1 and 2 will be described.

First Embodiment

Figure 3:
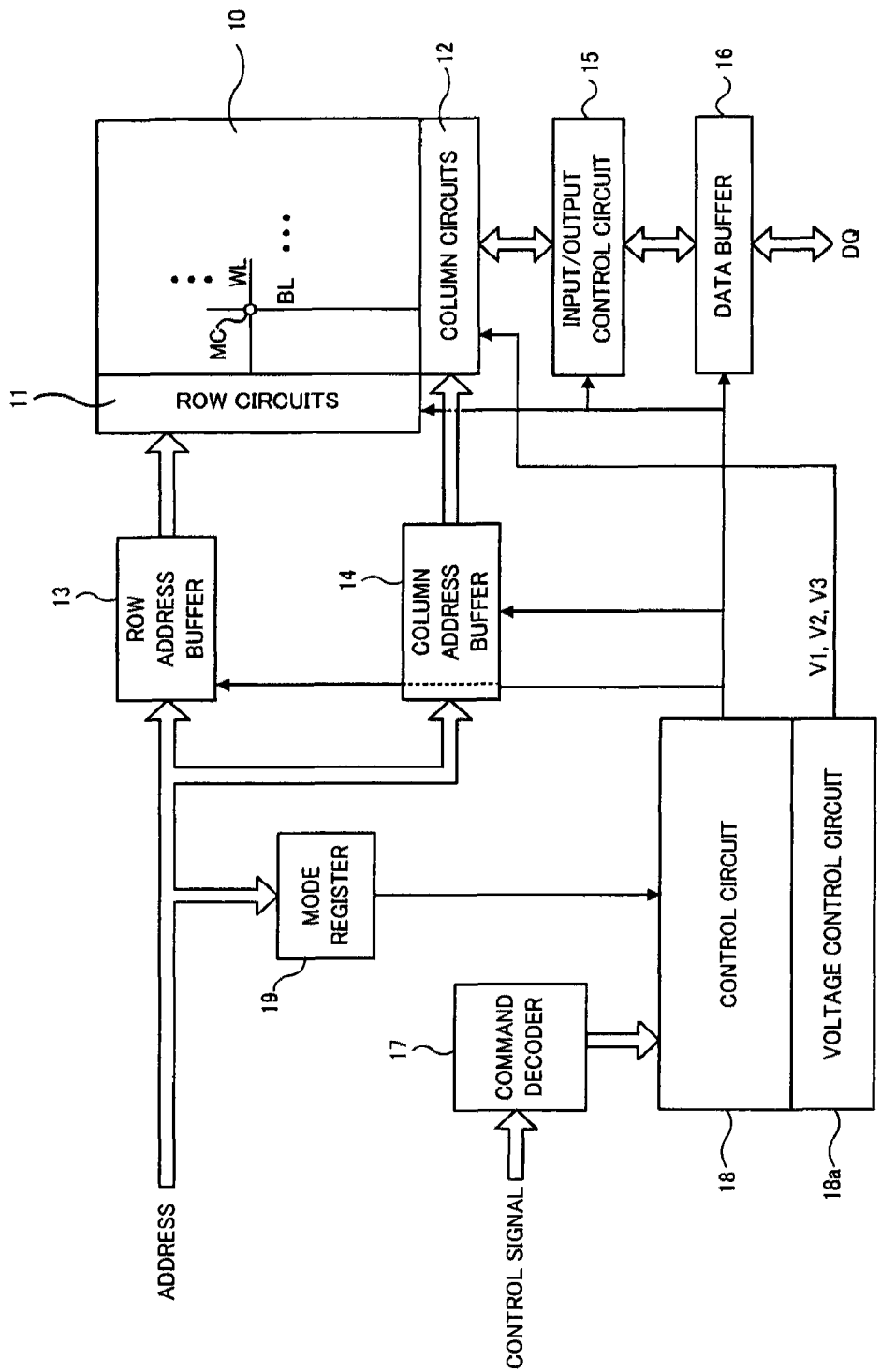
FIG. 3 is a block diagram showing an entire configuration of a semiconductor device of a first embodiment.

In a first embodiment, the invention is applied to a semiconductor device having current change memory cells, which comprises a memory cell array having a hierarchical bit line structure. FIG. 3 is a block diagram showing an entire configuration of the semiconductor device of the first embodiment. The semiconductor device shown in FIG. 3 comprises a memory cell array 10 including a large number of current change memory cells MC arranged at intersections of a plurality of word lines WL and a plurality of bit lines BL, and row circuits 11 and column circuits 12 that are attached to the memory cell array 10. The row circuits 11 includes a large number of circuits provided corresponding to the plurality of word lines WL, and the column circuits 12 includes a large number of circuits provided corresponding to the plurality of bit lines BL. In addition, since the memory cell array 10 employs the hierarchical bit line structure, the bit lines BL are hierarchized into global bit lines GBL of an upper hierarchy and the above mentioned bit lines BL of a lower hierarchy, which will be described in detail later.

An externally input address includes a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the semiconductor device based on externally input control signals and sends the command to a control circuit 18. The control circuit 18 controls operations of respective parts of the semiconductor device according to a command type determined by the command decoder 17. The control circuit 18 controls the operations in conjunction with an internal clock generated by a clock generation circuit (not shown). A mode register 19 selectively sets operation modes of the semiconductor device based on the above address and sends setting information to the control circuit 18. Further, the control circuit 18 includes a voltage control circuit 18a that controls at least the potentials V1, V2 and V3 shown in FIG. 1 and supplies these potentials to the sense amplifiers SA of the column circuits 12 thorough different signal lines. The potential V1 is supplied through a first signal line. When the first signal line transmits a signal having a binary logic value, for example, logic value "1" is the first potential and logic value "0" is the ground potential.

Figure 4:
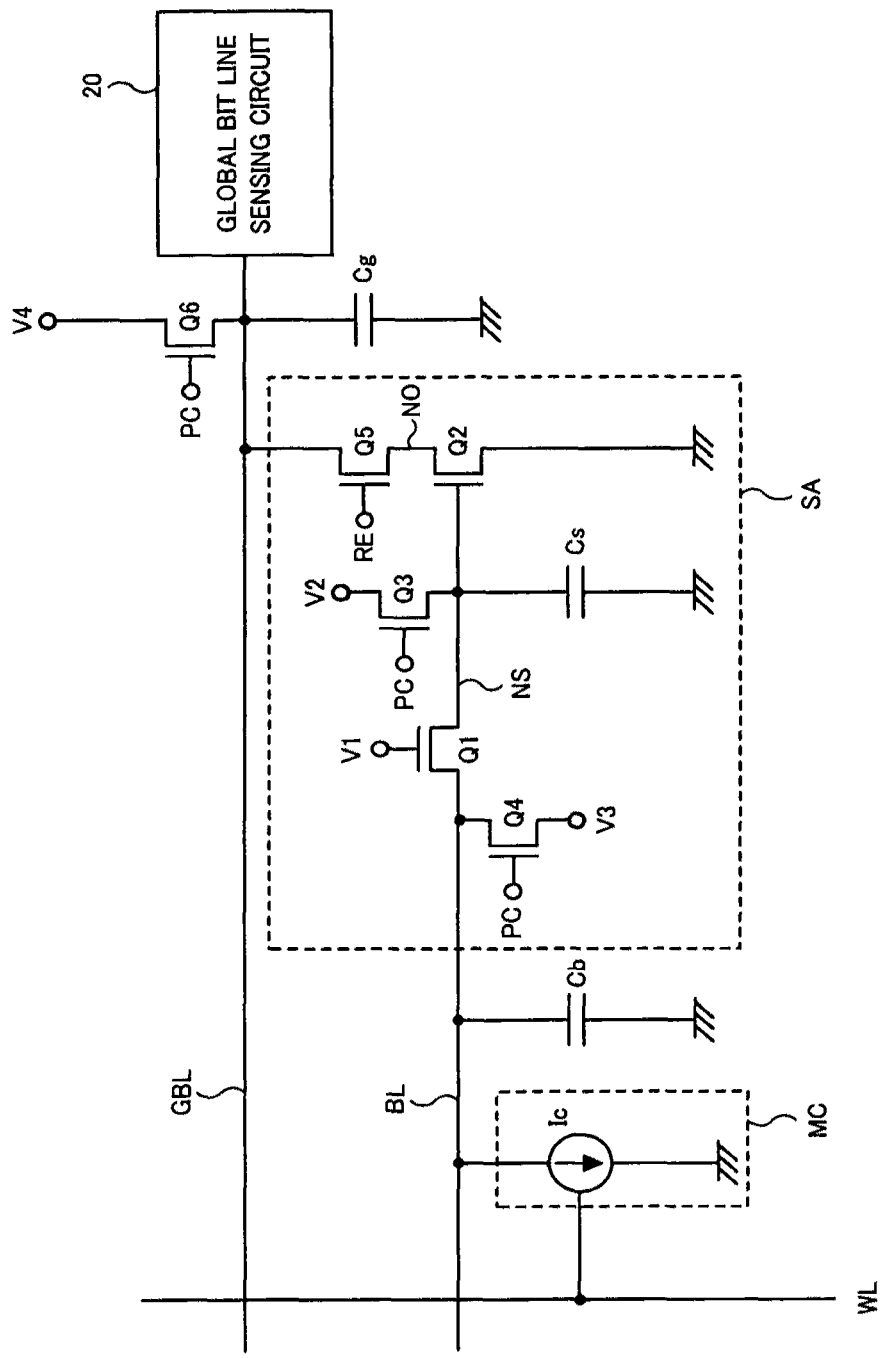
FIG. 4 is a diagram showing a configuration example in a range including a sense amplifier and a memory cell in the semiconductor device of the first embodiment.

Next, FIG. 4 shows a configuration example in the same range as in FIG. 1, which includes the sense amplifier SA and the current change memory cell MC in the semiconductor device of the first embodiment. In the circuit configuration shown in FIG. 4, portions of the memory cell MC, the bit line BL, and the transistors Q1, Q2, Q3 and Q4 in the sense amplifier SA are configured in the same manner as in FIG. 1. Meanwhile, in FIG. 4, an NMOS type transistor Q5 is provided in the sense amplifier SA, and the global bit line GBL, a global bit line sensing circuit 20 and an NMOS type transistor Q6 are respectively provided outside the sense amplifier SA. In addition, one word line WL corresponding to the memory cell MC is shown in addition to one bit line BL.

In the sense amplifier SA, the transistor Q5 for read control has a gate terminal to which a read control signal RE is applied, a source terminal connected to the output node NO, and a drain terminal connected to the global bit line GBL. When the read control signal RE is set to a high level, a drain current of the transistor Q2 flows from the global bit line GBL to the ground through the transistors Q5 and Q2. The transistor Q6 functioning as a potential supply circuit to the global bit line GBL supplies a potential V4 (the fourth potential) to the global bit line GBL in response to the precharge control signal PC. Further, the global bit line sensing circuit 20 (the global sense amplifier) is a circuit that senses and latches a signal transmitted to the global bit line GBL through the bit line BL and the sense amplifier SA.

In addition, FIG. 4 shows only one bit line BL of the lower hierarchy and one global bit line GBL of the upper hierarchy, in practice a plurality of bit lines BL are arranged for the one global bit line GBL, and the bit lines BL are segmented in an extending direction of the global bit line GBL. Thus, a plurality of sense amplifiers SA are arranged, the number of which is the same as the plurality of bit lines BL. Then, one of the plurality of bit lines BL is selectively connected to the global bit line GBL via the sense amplifier SA. Further, there is a parasitic capacitance Cg on the global bit line GBL, as shown in FIG. 4.

Figure 5:
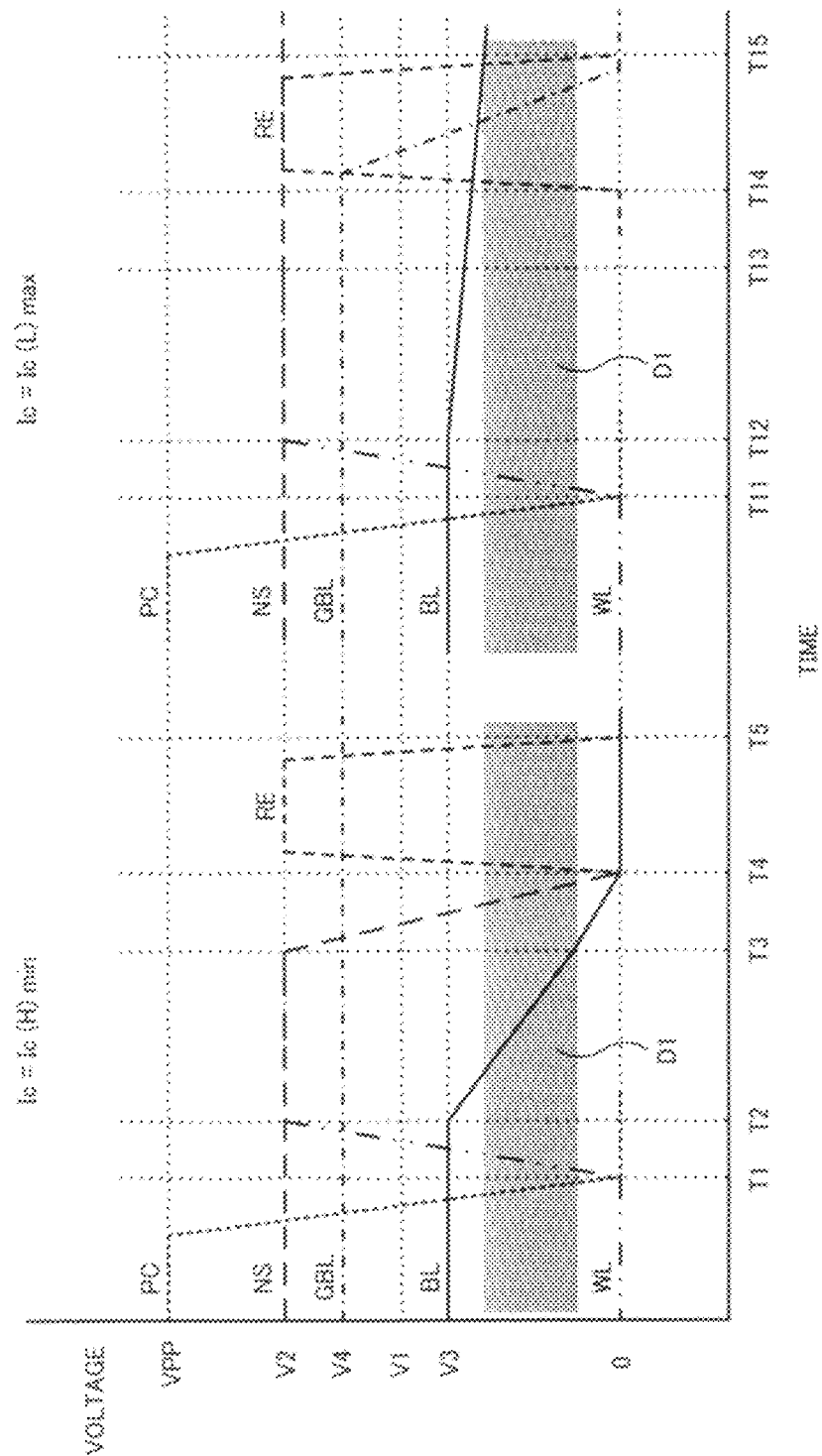
FIG. 5 is a diagram showing operation waveforms in a read operation of the semiconductor device of the first embodiment.

FIG. 5 shows operation waveforms in the read operation of the semiconductor device of the first embodiment. The left part of FIG. 5 shows operation waveforms in a case of reading the memory cell MC storing high level data, and the right part of FIG. 5 shows operation waveforms in a case of reading the memory cell MC storing low level data. Here, the meanings of Ic(H)min (left side) and Ic(L)max (right side) corresponding to the value of the current value Ic of the memory cell MC, and the meaning of the potential distribution D1 of the predetermined potential V1−Vt1, and the notation of the times T1 to T5, T11 to T15 are the same as those in FIG. 2. Most of operation waveforms shown in FIG. 5 are common to the operation waveforms in FIG. 2, and thus different points will be mainly described below.

In the read operation of the high level data, during the precharge period prior to the time T1, not only the sense node NS and the bit line BL but also the global bit line GBL is in a state of being precharged to the potential V4. Further, the word line WL is maintained at the ground potential as a non-selected state. When the precharge control signal PC is set to a low level at the time T1, the global bit line GBL becomes floating in a state of being precharged to the potential V4. Subsequently, during a period from the time T1 to the time T2, the word line WL is driven to the potential V2 as a selected state so that a memory cell MC is selected. After the same operation as in FIG. 2 from the time T2 to the time T4, the potential of the bit line BL and the potential of the sense node NS reach the ground potential, respectively. The read control signal RE is set to the high level (the potential V2) during a period between the times T4 and T5, and the transistor Q2 is in an OFF state during this period so that the global bit line GBL continues to be maintained at the potential V4. In this state, sensing of the global bit line sensing circuit 20 is performed, and thereby the read operation of the high level data finishes.

Meanwhile, in the read operation of the low level data, the same operations as the read operation of the high level data are performed until the memory cell MC is selected. Subsequently, during a period from the time T14 to the time T15, since the sense node NS continues to be maintained at the potential V2, as described by referring to FIG. 2 of the first embodiment. Therefore, when the read control signal RE is set to a high level, both the transistors Q2 and Q5 go into an ON state. As a result, electric charge is extracted from the global bit line GBL to the ground thorough the transistors Q5 and Q2, and thus the potential of the global bit line GBL decreases from the potential V4 to the ground potential. The sensing of the global bit line sensing circuit 20 is performed in this state, and thereby the read operation of the low level data finishes.

Next, the current change memory cell MC shown in FIG. 4 will be specifically described. FIGS. 6A to 6E show variations of the current change memory cell MC to which the invention can be applied. A memory cell MCa shown in FIG.

6A is composed of a MOS type select transistor having a gate terminal connected to the word line WL and a drain terminal connected to the bit line BL, and a resistance element having one terminal connected to the ground and the other terminal connected to a source terminal of the select transistor. The memory cell MCa stores data in accordance with an amount of an ON current Ic that depends on a resistance value of the resistance element.

Figure 6:
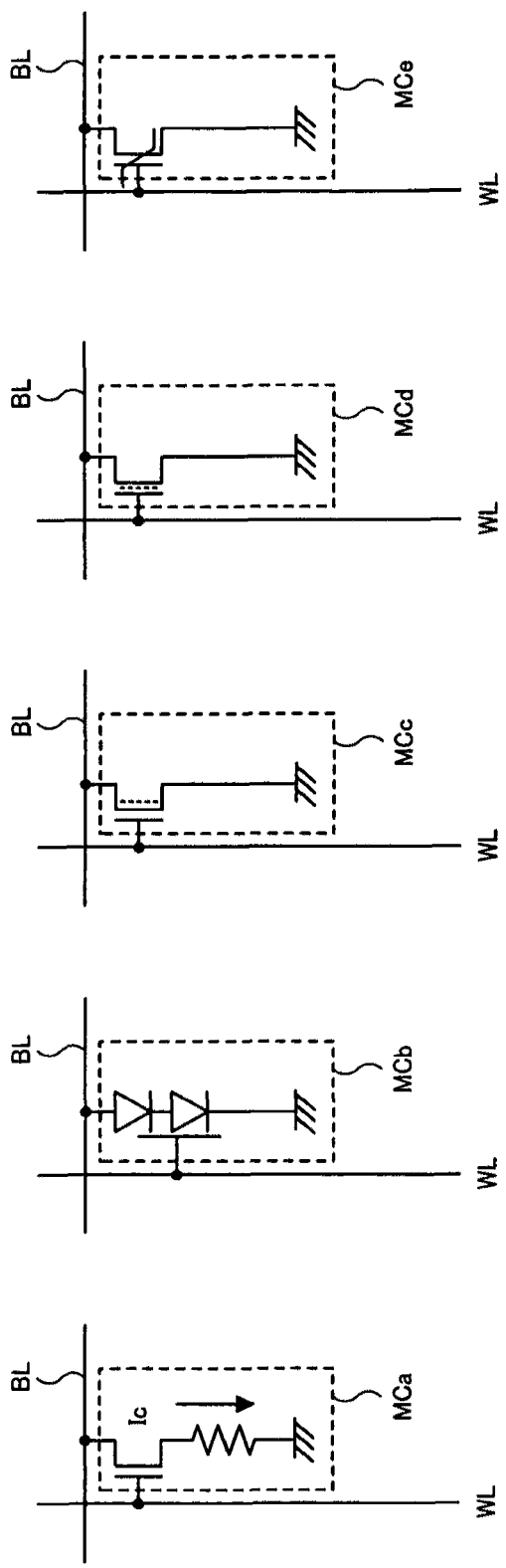
FIGS. 6A to 6E are diagrams showing specific examples of a current change memory cell to which the invention can be applied.

A memory cell MCb shown in FIG. 6B is composed of a gated thyristor having a gate terminal connected to the word line WL, an anode connected to the bit line BL, and a cathode connected to the ground. The gated thyristor of the memory cell MCb has a floating body structure in which a threshold voltage changes corresponding to an amount of electric charge stored in the floating body, and stores data in accordance with an amount of the ON current Ic that depends on a change in the threshold voltage.

A memory cell MCc shown in FIG. 6C is composed of a MOS transistor having a gate terminal connected to the word line WL, a source terminal connected to the ground and a drain terminal connected to the bit line BL. The MOS transistor of the memory cell MCc has the floating body structure in which a threshold voltage changes corresponding to an amount of electric charge stored in the floating body, and stores data in accordance with an amount of the ON current Ic that depends on a change in the threshold voltage.

A memory cell MCd shown in FIG. 6D is composed of a MOS transistor having a gate terminal connected to the word line WL, a source terminal connected to the ground and a drain terminal connected to the bit line BL. The MOS transistor of the memory cell MCd has a charge storage region in a gate oxide film, in which a threshold voltage changes corresponding to an amount of electric charge stored in the charge storage region, and stores data in accordance with an amount of the ON current Ic that depends on a change in the threshold voltage.

A memory cell MCe shown in FIG. 6E is composed of a MOS transistor having a gate terminal connected to the word line WL, a source terminal connected to the ground and a drain terminal connected to the bit line BL. The MOS transistor of the memory cell MCe has a gate oxide film composed of a ferroelectric film, in which a threshold voltage changes corresponding to a direction of polarization of the ferroelectric film, and stores data in accordance with an amount of the ON current Ic that depends on a change in the threshold voltage.

Figure 7:
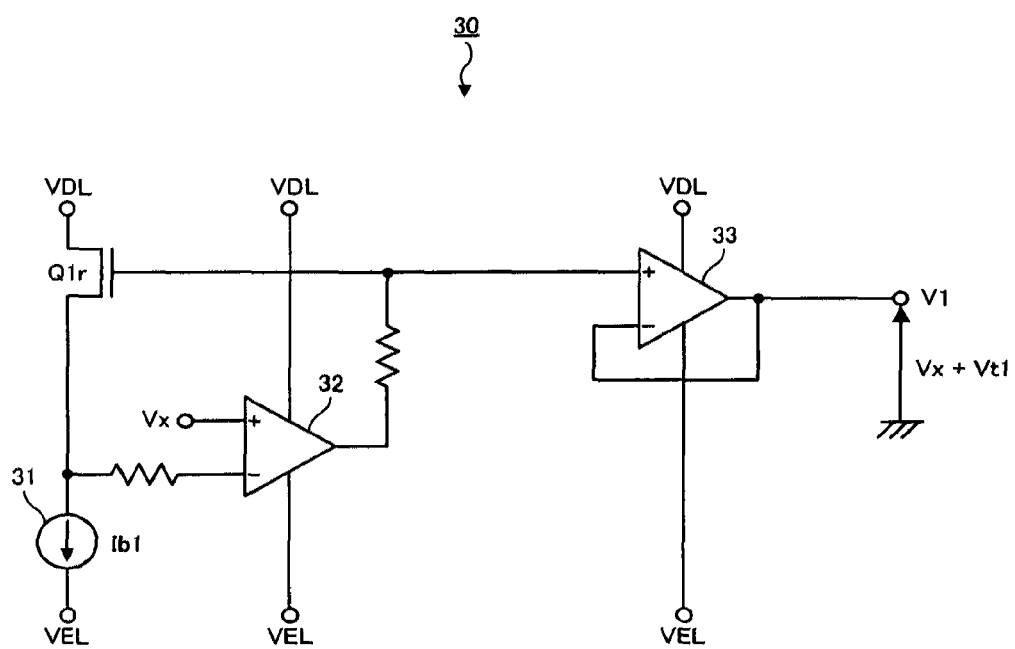
FIG. 7 is a diagram showing a circuit configuration example of a V1 generating circuit.

Next, a V1 generating circuit (the first potential generating circuit) for generating the potential V1 supplied to the transistor Q1 of FIG. 4 will be described. FIG. 7 shows a circuit configuration example of the V1 generating circuit 30. For example, the V1 generating circuit 30 is attached to the voltage control circuit 18a of FIG. 3 (or included therein), which is a feedback type voltage generating circuit generating the potential V1 with which fluctuation of the threshold voltage Vt1 is compensated. As shown in FIG. 7, the V1 generating circuit 30 includes a replica transistor Q1r, a constant current source 31, and two operational amplifiers 32 and 33. A positive voltage VDL and a negative voltage VEL are used as a pair of constant voltage supplies, the positive voltage VDL is supplied to the replica transistor Q1r and the operational amplifiers 32 and 33, and the negative voltage VEL is supplied to one end of the constant current source 31 and the operational amplifiers 32 and 33.

In FIG. 7, the replica transistor Q1r is a MOS transistor being used as a replica of the transistor Q1 included in the sense amplifier SA, and is formed to have approximately the same size and shape as the transistor Q1, which has a function to monitor fluctuation and temperature dependence of the threshold voltage Vt1 of the transistor Q1. The constant current source 31 for flowing a constant current Ib1 corresponding to the threshold voltage Vt1 is connected between the source terminal of the replica transistor Q1r and the negative voltage VEL. The operational amplifier 32 has a minus input terminal receiving a source voltage of the replica transistor Q1r via a resistor, and a plus input terminal receiving a potential Vx. An output voltage of the operational amplifier 32 is inputted to the gate terminal of the replica transistor Q1r via a resistor. Thereby, feedback control is performed so that the output voltage of the operational amplifier 32 becomes equal to a value obtained by adding the potential Vx to the threshold voltage Vt1 in a state where the current Ib1 flows through the replica transistor Q1r. Meanwhile, the subsequent operational amplifier 33 receiving the output voltage of the operational amplifier 32 forms a voltage follower for enhancing current driving ability, and outputs the potential V1 that is equal to Vx+Vt1.

The potential Vx inputted to the plus input terminal of the operational amplifier 32 is preferably set to a voltage value near the center of the potential distribution D1 of the predetermined potential V1−Vt1 shown in FIG. 5. For example, Vx=V3/2 can be set. By setting in this manner, the potential Vx is maintained constant when the threshold voltage Vt1 of the transistor Q1 changes depending on process variation and temperature, and thus the predetermined potential V1−Vt1 is always constant. Here, the potential distribution D1 of the predetermined potential V1−Vt1 is determined by a random variation range of the threshold voltage Vt of the transistor Q1 in a chip. Therefore, this variation range can be narrowed by the above setting, thereby obtaining an effect of improving operating margin of the sense amplifier SA.

In addition, without being limited to the configuration shown in FIG. 7 in which one replica transistor Q1r is provided, a plurality of replica transistors Q1r may be connected in parallel to form the V1 generating circuit 30 of FIG. 7. By monitoring threshold voltages Vt1 of MOS transistors Q1 using the plurality of replica transistors Q1r, a difference from an average value of the threshold voltages Vt of the transistors Q1 that are used in the sense amplifier SA can be reduced as much as possible.

Figure 8:
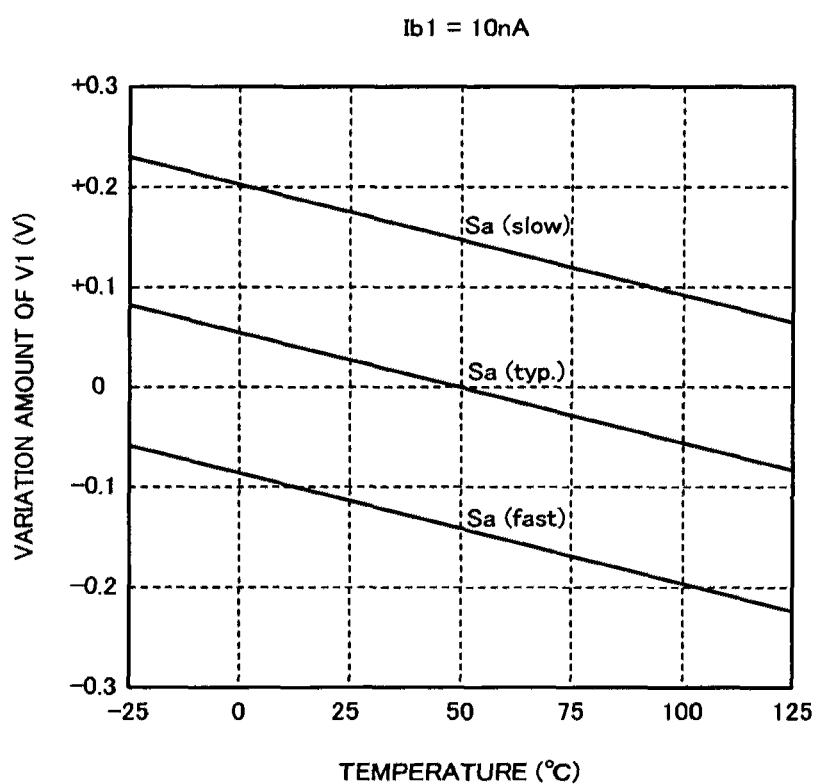
FIG. 8 is a graph showing an example of process/temperature dependence of a potential V1 that is outputted from the V1 generating circuit 30 of FIG. 7.

FIG. 8 is a graph showing an example of process/temperature dependence of the potential V1 that is outputted from the V1 generating circuit 30 of FIG. 7. In FIG. 8, three types of characteristics including a typical operation characteristic Sa(typ), a fast operation characteristic Sa(fast), and a slow operation characteristic Sa(slow) are compared corresponding to variation in manufacturing process, and each relation between the temperature and a fluctuation amount of the potential V1 is shown in the graph. FIG. 8 shows an example in which the current Ib1 of the constant current source 31 of FIG. 7 is set to 10 nA. That is, since the current flowing though the transistor Q1 is relatively small in the sensing operation of the sense amplifier SA, it is preferable to correspondingly set the current Ib1 to a relatively small value. As described above, by employing the V1 generating circuit 30 having the configuration of FIG. 7, the potential V1 capable of compensating the process variation and the temperature dependence of the threshold voltage Vt1 of the transistor Q1 so as to stabilize the operation of the transistor Q1.

Second Embodiment

Figure 9:
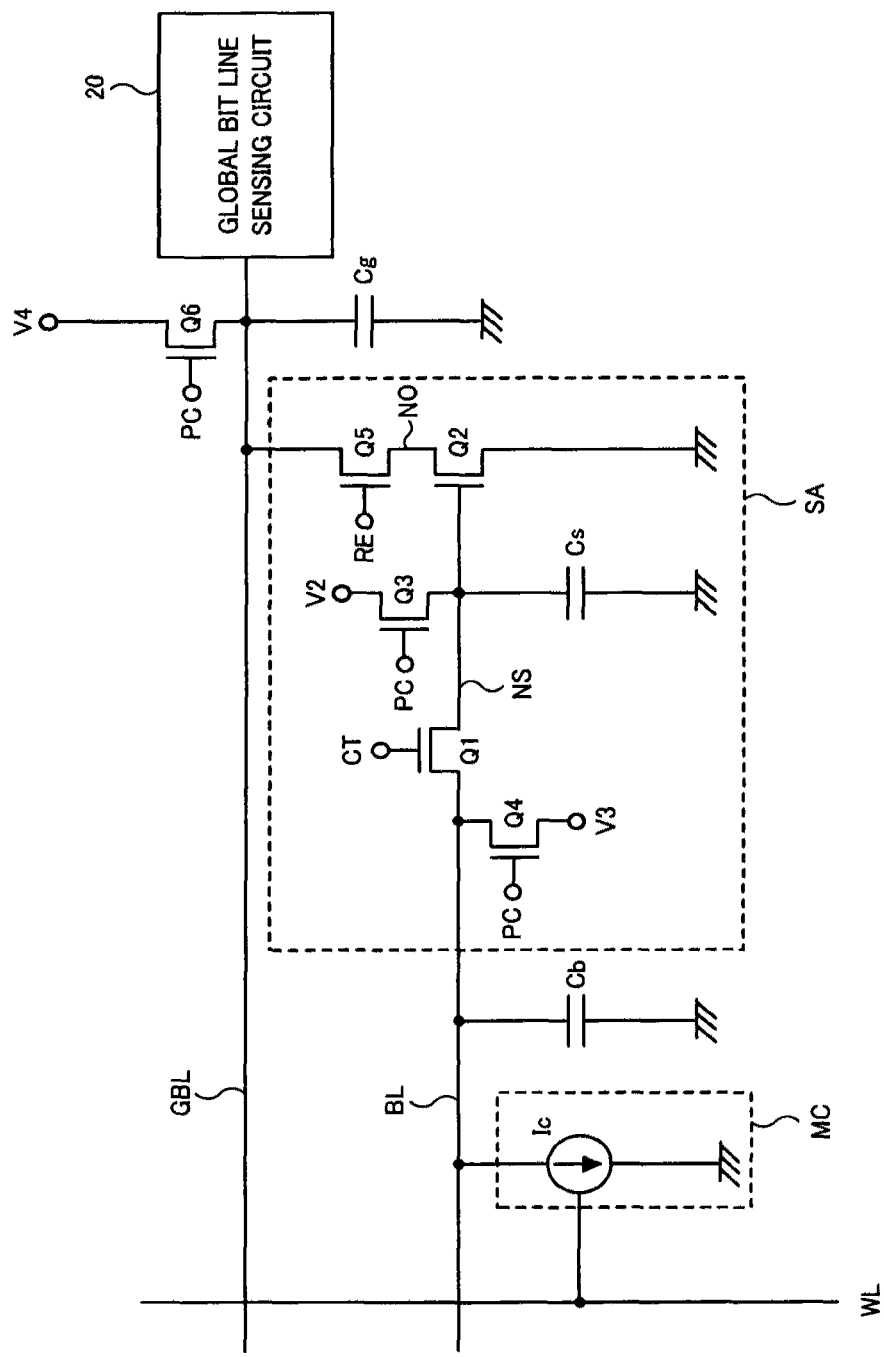
FIG. 9 is a diagram showing a configuration example in the range including the sense amplifier and the memory cell in the semiconductor device of a second embodiment.

In a second embodiment, the invention is applied to a semiconductor device comprising a memory cell array having the hierarchical bit line structure, similarly as in the first embodiment. However, the second embodiment is different from the first embodiment in that potential control for the sense amplifier SA is modified. Here, the entire configuration of the semiconductor device of the first embodiment (FIG. 3) is common to the second embodiment, so description thereof will be omitted. FIG. 9 shows a configuration example in a range including the sense amplifier SA and the memory cell MC in the semiconductor device of the second embodiment. In the semiconductor device of FIG. 9, it is different from FIG. 4 of the first embodiment in that a transfer control voltage CT is applied to the gate terminal of the transistor Q1 instead of the potential V1. The transfer control voltage CT is set to either the potential V1 or the ground potential by the voltage control circuit 18a, as described later. Other points in FIG. 9 are the same as in FIG. 4, so description thereof will be omitted.

Figure 10:
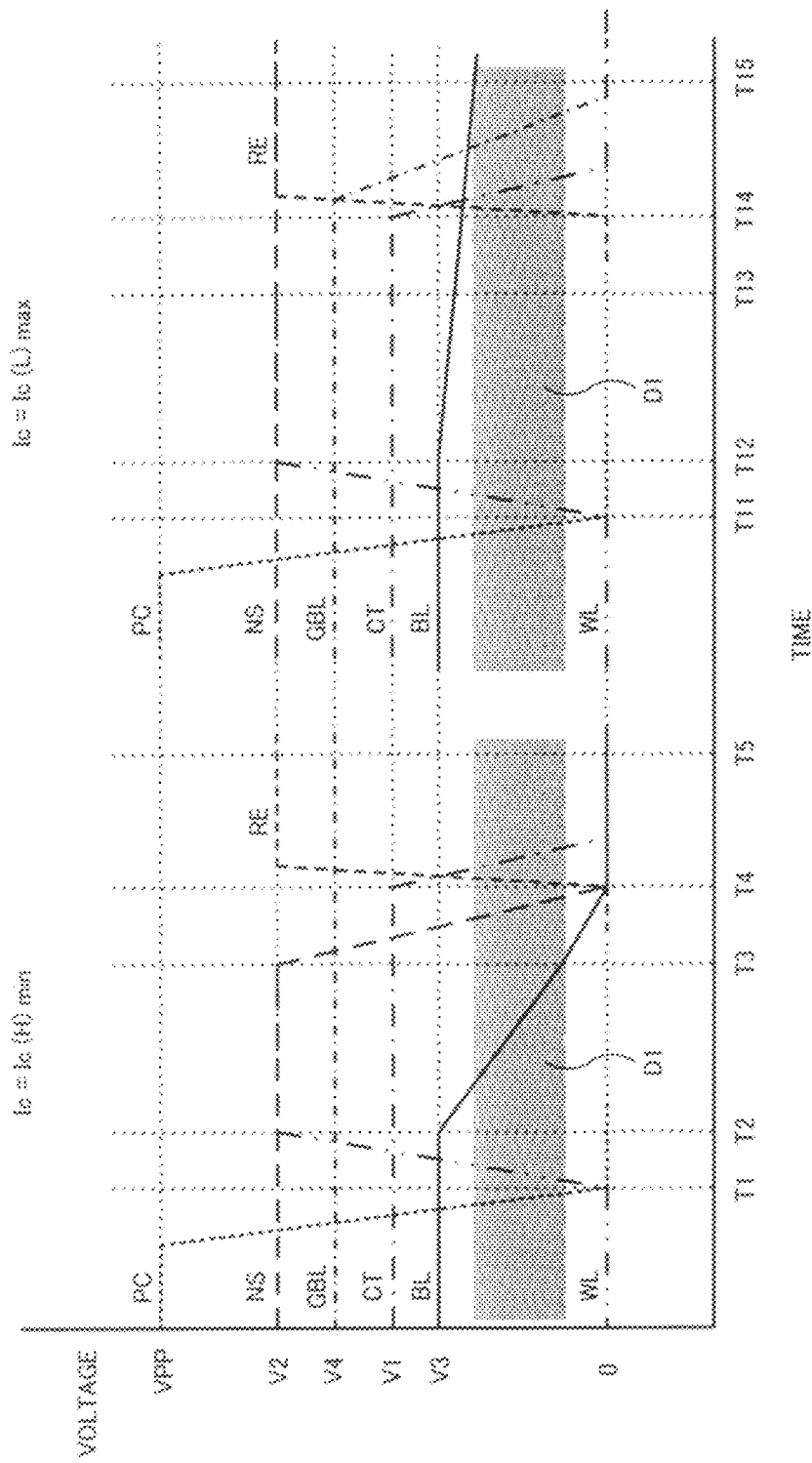
FIG. 10 is a diagram showing operation waveforms in a read operation of a semiconductor device of the second embodiment.

FIG. 10 shows operation waveforms in the read operation of the semiconductor device of the second embodiment. The left part of FIG. 10 shows operation waveforms in a case of reading the memory cell MC storing high level data, and the right part of FIG. 10 shows operation waveforms in a case of reading the memory cell MC storing low level data. Here, the meanings of Ic(H)min (left side) and Ic(L)max (right side) corresponding to the value of the current value Ic of the memory cell MC, and the meaning of the potential distribution D1 of the predetermined potential V1−Vt1, and the notation of the times T1 to T5, T11 to T15 are the same as those in FIG. 2. Most of operation waveforms shown in FIG. 10 are common to the operation waveforms in FIG. 5 of the first embodiment, and thus different points will be mainly described below.

In the high level data of the read operation, during the precharge period prior to the time T1, the transfer control voltage CT is set to the potential V1. Accordingly, this is the same state as in FIG. 5 at this point, and thereafter the transfer control voltage CT is maintained at the potential V1 until the time T4. Then, since the transfer control voltage CT is changed from the potential V1 to the ground potential at the time T4 so that the transistor Q1 turns off. Accordingly, thereafter the potential of the sense node NS is not changed, the sensing operation for the high level data of the memory cell MC is performed, and thereby the read operation of the high level data finishes. Further, in the read operation of the low level data, the control of the transfer control voltage CT is performed in the same manner as in the read operation of the high level data, and other controls are performed in the same manner as in FIG. 5 of the first embodiment. That is, after the time T14 at which the transfer control voltage CT is changed from the potential V1 to the ground potential, the sensing operation for the low level data of the memory cell MC is performed, and thereby the read operation of the low level data finishes.

As described above, in the read operation of the first embodiment, the end point of the period to maintain the read control signal RE to the high level is restricted to the Time T5 (FIG. 5). On the other hand, in the read operation of the second embodiment, the end point of the period to maintain the read control signal RE to the high level is not required to be restricted to the Time T5 (FIG. 5). Therefore, it is possible to improve operating margin in the read operation.

Here, other additional descriptions in the first embodiment are also applicable in the second embodiment, regarding the variations of the current change memory cell MC shown in FIGS. 6A to 6E, the circuit configuration of the V1 generating circuit 30 shown in FIG. 7, and the process/temperature dependence of the potential V1 shown in FIG. 8.

Further, in the second embodiment, a specific capacitance element may be used as the parasitic capacitance Cs of the sense node NS. By this, it is possible to suppress a decrease in potential of the sense node NS due to coupling noise between the gate and source of the transistor Q1 in association with the transition of the transfer control voltage CT from the potential V1 toward the ground potential. Furthermore, as another measure, a slew rate of the transfer control voltage CT may be controlled in addition to the specific capacitance element.

Third Embodiment

Figure 11:
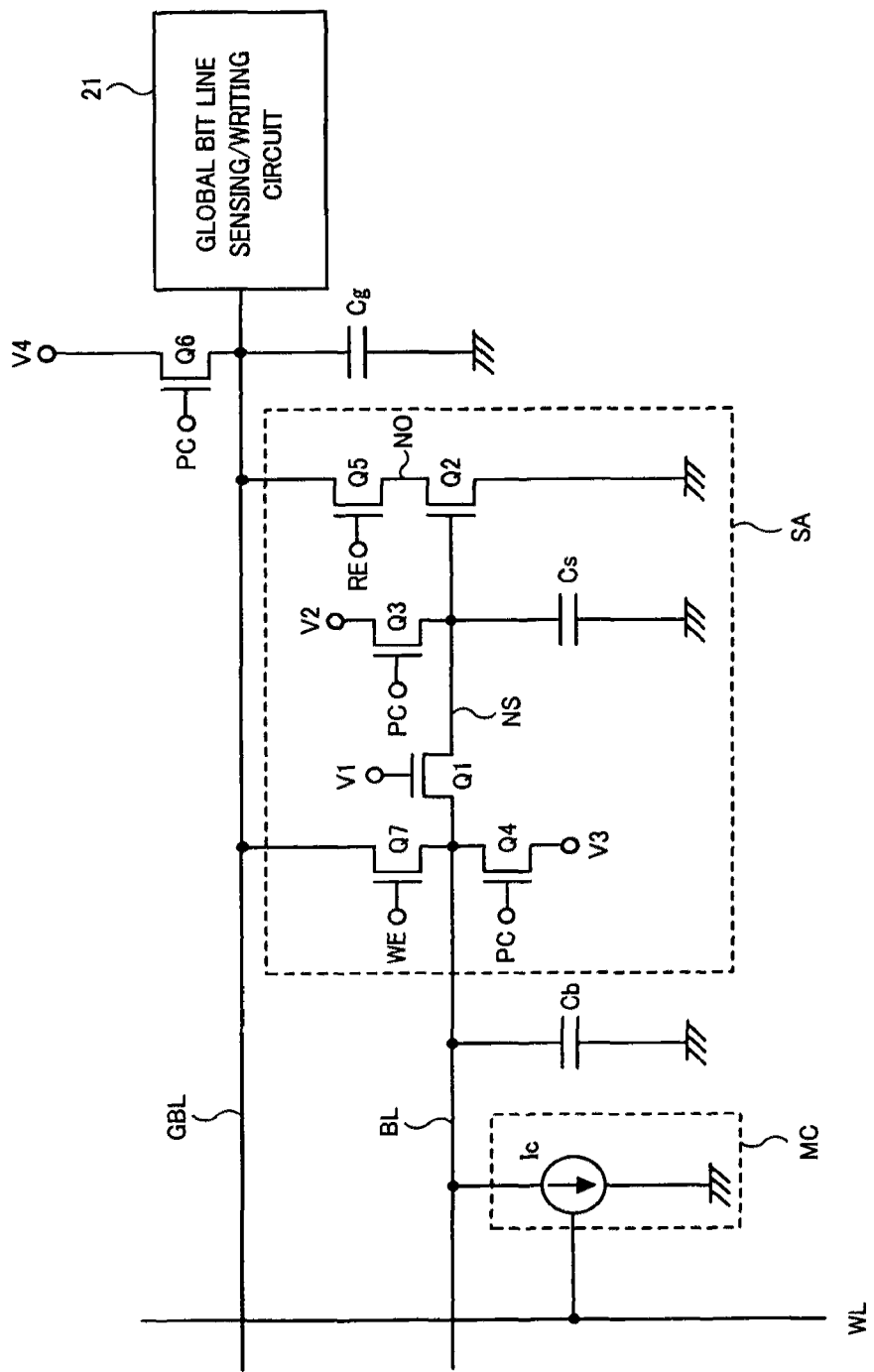
FIG. 11 is a diagram showing a configuration example in the range including the sense amplifier and the memory cell in the semiconductor device of a third embodiment.

In a third embodiment, the invention is applied to a semiconductor device comprising a memory cell array having the hierarchical bit line structure, similarly as in the first embodiment. However, a configuration of the third embodiment is partially modified from that of the first embodiment. Here, the entire configuration of the semiconductor device of the first embodiment (FIG. 3) is common to the third embodiment, so description thereof will be omitted. FIG. 11 shows a configuration example in a range including the sense amplifier SA and the memory cell MC in the semiconductor device of the third embodiment. In the semiconductor device of FIG. 11, it is different from FIG. 4 of the first embodiment in that an NMOS type transistor Q7 is added to the sense amplifier SA and that the global bit line sensing circuit 20 is replaced with a global bit line sensing/writing circuit 21.

The transistor Q7 for write control has a gate terminal to which a write control signal WE is applied, a source terminal connected to the bit line BL, and a drain terminal connected to the global bit line GBL. When the write control signal WE is set to a high level, the global bit line GBL and the bit line BL are directly connected to each other. The global bit line sensing/writing circuit 21 is a circuit that senses and latches a signal transmitted from the bit line BL to the global bit line GBL in the read operation and that writes data into the memory cell MC from the global bit line GBL through the transistor Q7 and the bit line BL in the write operation. Other configurations are the same as those in FIG. 4 and operation waveforms in the read operation are the same as those in FIG. 5, so description thereof will be omitted.

Here, other additional descriptions in the first and second embodiments are also applicable in the third embodiment, regarding the variations of the current change memory cell MC shown in FIGS. 6A to 6E, the circuit configuration of the V1 generating circuit 30 shown in FIG. 7, and the process/temperature dependence of the potential V1 shown in FIG. 8.

[Data Processing System]

Figure 12:
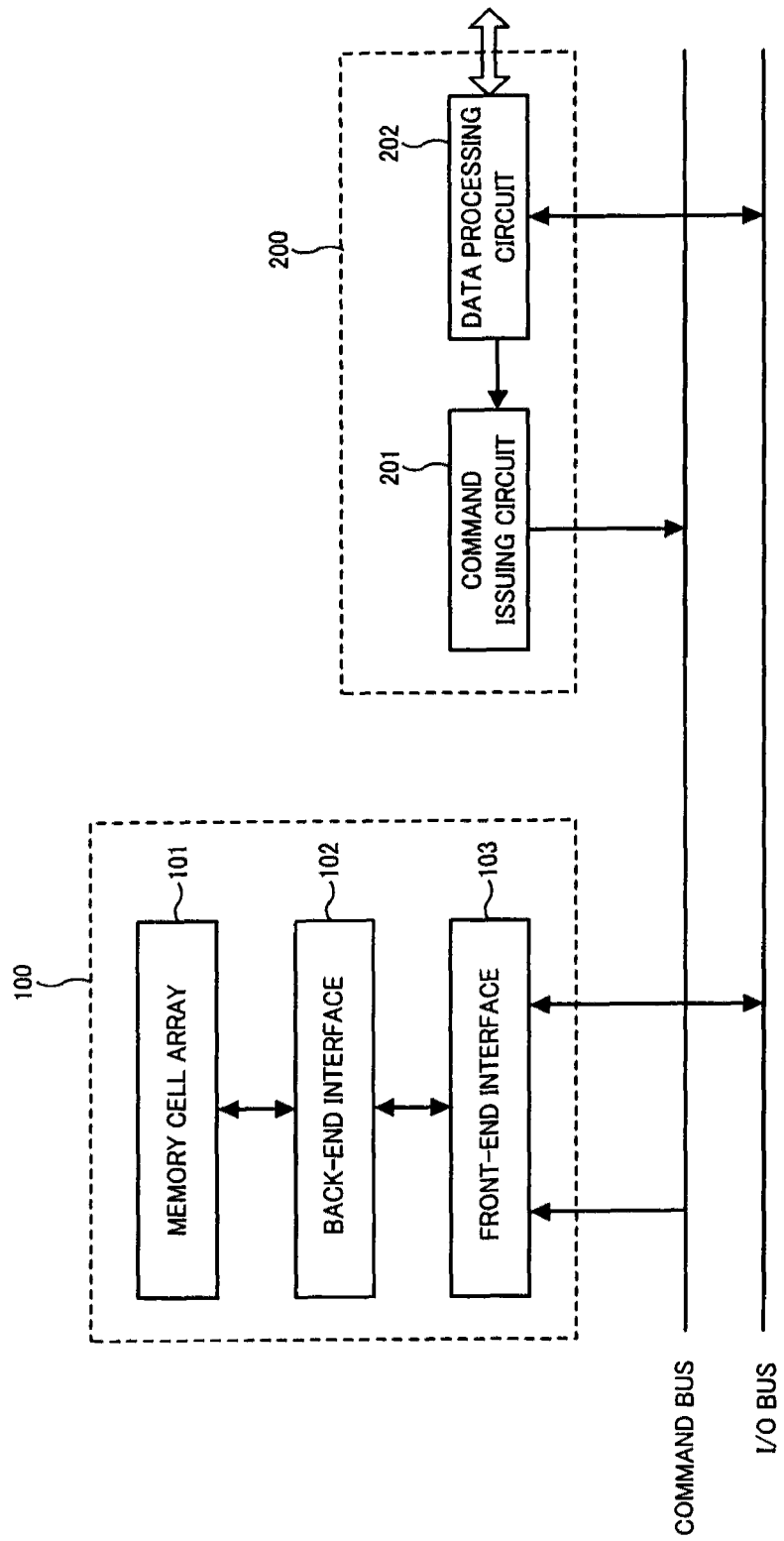
FIG. 12 is a diagram showing a configuration example of a data processing system comprising the semiconductor device having the configuration described in the embodiments and a controller controlling operations of the semiconductor device.

Next, a case in which the present invention is applied to a data processing system comprising a semiconductor device will be described. FIG. 12 shows a configuration example of the data processing system comprising a semiconductor device 100 having the configuration described in the embodiments and a controller 200 controlling operations of the semiconductor device 100.

The semiconductor device 100 is provided with a memory cell array 101 including current change memory cells MC of the embodiments, a back-end interface 102 and a front-end interface 103. The memory cell array 101 includes the memory cell array 10 of the above embodiments. The back-end interface 102 includes peripheral circuits of the memory cell array 10. The front-end interface 103 has a function to communicate with the controller 200 through a command bus and an I/O bus. Although FIG. 12 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 12.

The data processing system of FIG. 12 is, for example, a system implemented in electronics devices such as personal computers, communication electronics devices, mobile electronics devices and other industrial/consumer electronics devices.

In the foregoing, the preferred embodiments of the present invention have been described. However the present invention is not limited to the above embodiments and can variously be modified without departing the essentials of the present invention. Various circuit configurations can be employed for the sense amplifier SA and other circuits without being limited to the configurations described in the embodiments.

The present invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like, in addition to the semiconductor device having current change memory cells. Further, the present invention can be applied to various devices such as SOC (System on Chip), MCP (Multi Chip Package) and POP (Package on Package) and the like.

Further, transistors of the present invention are Field-Effect Transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device comprising:
a memory cell storing data in accordance with an amount of current supplying capability:
a bit line electrically connected to the memory cell, the bit line transmitting the data of the memory cell;
a first transistor having a gate terminal connected to a first signal line supplied with at least a first potential as a transfer control voltage, one source/drain terminal connected to the bit line, and another source/drain terminal connected to a sense node;
a second transistor having a gate terminal connected to the sense node, a drain terminal connected to an output node, and a source terminal connected to a signal line supplied with a low potential, the second transistor amplifying a signal transmitted from the bit line to the sense node via the first transistor;
a sense node potential supplying circuit supplying a second potential to the sense node in response to a precharge control signal;
a bit line potential supplying circuit supplying a third potential to the bit line in response to the precharge control signal; and
a potential control circuit controlling at least the first to third potentials,
wherein the potential control circuit controls the first potential to be set between the second and third potentials, controls the second potential to be larger in absolute value than the third potential, and controls a predetermined potential obtained by subtracting a threshold voltage of the first transistor from the first potential to be smaller in absolute value than the third potential and larger in absolute value than the low potential,
and a potential of the bit line transitions from the third potential toward the low potential in accordance with the data of the memory cell, regardless of "1" or "0" of the data.

2. The semiconductor device according to claim 1, wherein the predetermined potential has a potential distribution corresponding to a variation of the threshold voltage of the first transistor, an upper limit within a range of the potential distribution is smaller in absolute value than the third potential, and a lower limit within the range of the potential distribution is larger in absolute value than the low potential.

3. The semiconductor device according to claim 2, wherein the potential control circuit controls at least one of the first and third potentials so that the upper limit is smaller in absolute value than the third potential and the lower limit is larger in absolute value than the low potential.

4. The semiconductor device according to claim 1, further comprising a control circuit controlling the first signal line and a word line that electrically connects the memory cell to the bit line,
wherein at least when activating the word line, the control circuit controls a logic value of the first signal line so as to supply the first potential to the first transistor as the transfer control voltage.

5. The semiconductor device according to claim 4, wherein the first potential is supplied to the first transistor at least during a period from activating the word line to a point at which a potential of the sense node decreases from the second potential to a fourth potential.

6. The semiconductor device according to claim 5, wherein when the second transistor senses the potential of the sense node after reaching the fourth potential, the control circuit controls a logic value of the first signal line to transition from the first potential to the low potential so that the first transistor becomes non-conductive.

7. The semiconductor device according to claim 1,
wherein the sense node potential supplying circuit is a third transistor having a gate terminal to which the precharge control signal is applied, a source terminal connected to the sense node, and a drain terminal receiving the second potential,
and the bit line potential supplying circuit is a fourth transistor having a gate terminal to which the precharge control signal is applied, a source terminal connected to the bit line, and a drain terminal receiving the third potential.

8. The semiconductor device according to claim 1 further comprising:
a global bit line as an upper hierarchy of the bit line; and a fifth transistor controlling an electrical connection between the output node and the global bit line in response to a read control signal applied to a gate terminal thereof.

9. The semiconductor device according to claim 8, further comprising a global sense amplifier connected to the global bit line, the global sense amplifier sensing a signal of the global bit line.

10. The semiconductor device according to claim 9, further comprising a sixth transistor having a gate terminal to which the precharge control signal is applied, a source terminal connected to the global bit line, and a drain terminal receiving a fifth potential.

11. The semiconductor device according to claim 10 further comprising:
- a seventh transistor controlling an electrical connection between the bit line and the global bit line in response to a write control signal applied to a gate terminal thereof; and
- a write circuit writing data into the memory cell from the global bit line through the seventh transistor and the bit line, the write circuit being connected to the global bit line.

12. The semiconductor device according to claim 11, wherein each of the first to seventh transistors is an N type field effect transistor.

13. The semiconductor device according to claim 1, wherein the potential control circuit monitors fluctuation and temperature dependence of the threshold voltage of the first transistor and includes a first potential generating circuit generating the first potential with which the fluctuation and temperature dependence of the threshold voltage of the first transistor is compensated.

14. A semiconductor device comprising:
- a memory cell storing data in accordance with an amount of current supplying capability:
- a bit line electrically connected to the memory cell, the bit line transmitting the data of the memory cell;
- a first transistor having a gate terminal to which a first potential is applied, one source/drain terminal connected to the bit line, and another source/drain terminal connected to a sense node;
- a second transistor having a gate terminal connected to the sense node, a drain terminal connected to an output node, and a source terminal supplied with a low potential, the second transistor amplifying a signal transmitted from the bit line to the sense node via the first transistor;
- a sense node potential supplying circuit supplying a second potential to the sense node in response to a precharge control signal;
- a bit line potential supplying circuit supplying a third potential to the bit line in response to the precharge control signal; and
- a potential control circuit controlling at least the first to third potentials,
- wherein the potential control circuit controls the first potential to be between the second and third potentials, controls the second potential to be larger in absolute value than the third potential, and controls a predetermined potential obtained by subtracting a threshold voltage of the first transistor from the first potential to be smaller in absolute value than the third potential and larger in absolute value than the low potential.

15. The semiconductor device according to claim 14, wherein the predetermined potential has a potential distribution corresponding to a variation of the threshold voltage of the first transistor, an upper limit within a range of the potential distribution is smaller in absolute value than the third potential, and a lower limit within the range of the potential distribution is larger in absolute value than the low potential.

16. The semiconductor device according to claim 15, wherein the potential control circuit controls at least one of the first and third potentials so that the upper limit is smaller in absolute value than the third potential and the lower limit is larger in absolute value than the low potential.

17. The semiconductor device according to claim 14,
wherein the sense node potential supplying circuit is a third transistor having a gate terminal to which the precharge control signal is applied, a source terminal connected to the sense node, and a drain terminal receiving the second potential,
and the bit line potential supplying circuit is a fourth transistor having a gate terminal to which the precharge control signal is applied, a source terminal connected to the bit line, and a drain terminal receiving the third potential.

18. The semiconductor device according to claim 14 further comprising:
- a global bit line as an upper hierarchy of the bit line;
- a fifth transistor controlling an electrical connection between the output node and the global bit line in response to a read control signal applied to a gate terminal thereof; and
- a global sense amplifier connected to the global bit line, the global sense amplifier sensing a signal of the global bit line.

19. The semiconductor device according to claim 18, further comprising a sixth transistor having a gate terminal to which the precharge control signal is applied, a source terminal connected to the global bit line, and a drain terminal receiving a fourth potential.

20. The semiconductor device according to claim 19 further comprising:
- a seventh transistor controlling an electrical connection between the bit line and the global bit line in response to a write control signal applied to a gate terminal thereof; and
- a write circuit writing data into the memory cell from the global bit line through the seventh transistor and the bit line, the write circuit being connected to the global bit line.

21. The semiconductor device according to claim 14, wherein the potential control circuit monitors fluctuation and temperature dependence of the threshold voltage of the first transistor and includes a first potential generating circuit generating the first potential with which the fluctuation and temperature dependence of the threshold voltage of the first transistor is compensated.

* * * * *